United States Patent
Mantl et al.

(10) Patent No.: US 6,648,987 B1
(45) Date of Patent: Nov. 18, 2003

(54) METHOD FOR PRODUCING NANOSTRUCTURES IN THIN FILMS

(75) Inventors: Siegfried Mantl, Jülich (DE); Ludger Kappius, Bad Wünnenberg (DE); Qing-Tai Zhao, Jülich (DE); Armin Antons, Jülich (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 09/831,456

(22) PCT Filed: Nov. 18, 1999

(86) PCT No.: PCT/DE99/03683
§ 371 (c)(1),
(2), (4) Date: May 8, 2001

(87) PCT Pub. No.: WO00/30166
PCT Pub. Date: May 25, 2000

(30) Foreign Application Priority Data

Nov. 18, 1998 (DE) .......................................... 198 53 023

(51) Int. Cl.⁷ ................................................ C23C 8/04
(52) U.S. Cl. ...................... 148/279; 148/280; 148/281
(58) Field of Search .................. 148/279, 280, 148/281

(56) References Cited

U.S. PATENT DOCUMENTS 4,131,487 A 12/1978 Pearce et al.
4,227,944 A * 10/1980 Brown et al. .............. 148/279
4,577,396 A * 3/1986 Yamamoto et al. ............ 29/571

FOREIGN PATENT DOCUMENTS

GB 2320134 * 6/1998
JP 11-26458 * 1/1999
WO WO 99/05711 2/1999

OTHER PUBLICATIONS

"STrain–induced defects in $Si_{1-x}$–alloys layers . . . " published in Nuclear instruments and Methods in Physics Research B 124 (1997) 55–65.
"Modeling of local reduction in $TiSi_2$ and $CoSi_2$ growth . . ." published in 1996 IEEE.
"Submicrometer patterning of epitaxial $CoSi_2/Si(111)$ by local oxidation" published in Thin Solid Films 318 (1998) Apr. 15, Nos 1/2 (Klinkhammer et al.).
"Stress–Induced precipitation of dopants . . . " published in 8303 Semiconductor Science and Technology 8 (1993) Jul. (LaVia et al.).
"Lateral growth of platinum and palladium silicides . . . " published in Electronics and Optics 1985.

* cited by examiner

*Primary Examiner*—George Wyszomierski
(74) *Attorney, Agent, or Firm*—Herbert Dubno

(57) ABSTRACT

The invention relates to a method for producing a layer with a sub-micrometre structure on a substrate. First, a layer is formed on the substrate. Agents for creating elastic strains are then formed in at least one predetermined position on the layer and the layer is then subjected to a strain-dependent solid-state reaction. This results in material separating and consequently, in the layer being structured in this position.

6 Claims, 1 Drawing Sheet

PROCESS SEQUENCE
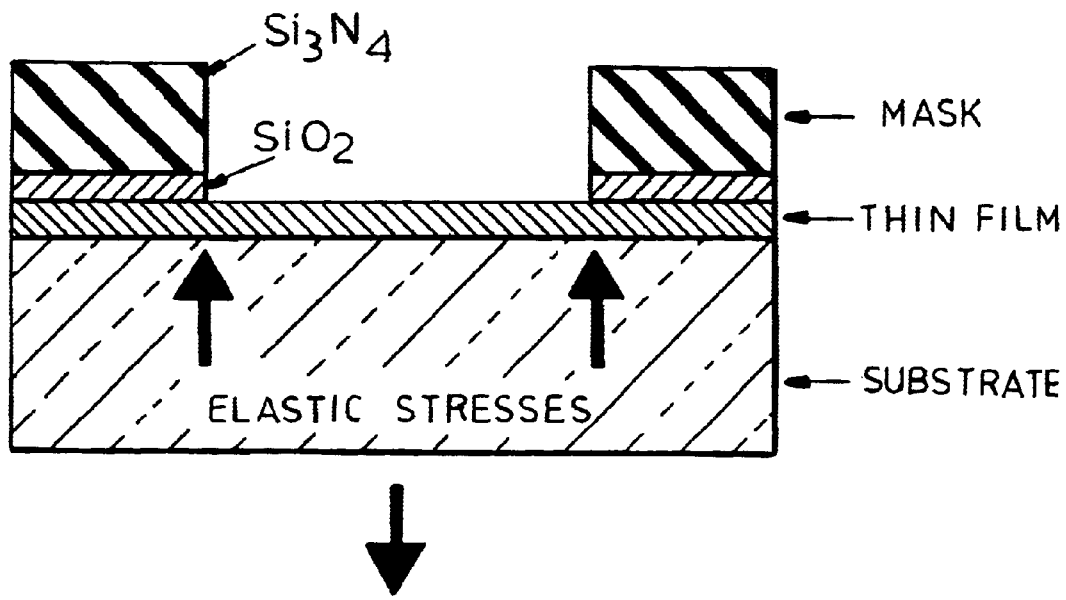
TEMPERATURE STEP
E.G. SILICIDE FORMATION
RESULTING STRUCTURE
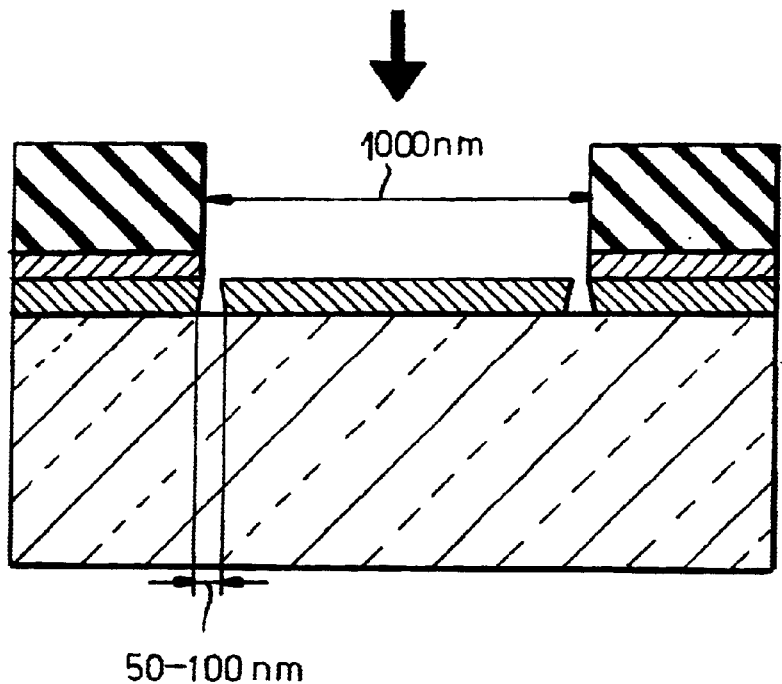

METHOD FOR PRODUCING NANOSTRUCTURES IN THIN FILMS

CROSS REFERENCE TO RELATED APPLICATIONS

This application is a national stage of PCT/DE99/03683 filed Nov. 18, 1999 and is based upon German national application 198 53 023.4 of Nov. 18, 1998 under the International Convention.

1. Field of the Invention

The invention relates to a method of producing a layer having a submicrometer structure. The invention further relates to a component such as a sensor, switch or optical device.

2. Background of the Invention

It is known, as state of the art, to produce submicrometer structures by the use of optical lithography. In this, the desired nanostructuring is formed with the aid of exposure-supported mask technology. The use of long wave UV light enables a resolution of up to 180 nm in projection exposure with expensive steppers.

Known methods with better resolution, like x-ray lithography, electron-beam projection lithography, ion beam lithography or the imprint process are in development (L. R. Harriott, Materials Science in Semiconductor Processing 1 (1998) 93–97). These processes have the disadvantage that they involve high technical expenditures and associated high cost.

It is thus desirable to develop methods which are based upon self-organization or other self-controlling processes. To produce a high output of such structures in production, it is desirable to utilize methods which can be carried out in parallel. In the patent application PCT/DE 96/00172, a method of structuring silicide films is described which is based upon local oxidation of silicides. The disadvantage is that the method has only practical utility for monocrystalline silicide layers. In polycrystalline silicide layers during the requisite oxidation at high temperatures, disadvantageous morphological holes are formed.

OBJECT OF THE INVENTION

It is thus the object of the invention to provide a method for producing a nanostructure which allows nanostructures to be produced also in polycrystalline layers with a self-controlling process, i.e. without the need to write the small structures directly therein.

SUMMARY OF THE INVENTION

According to the invention, for producing a layer having a submicrometer structure on a substrate, initially a layer is formed on a substrate. It is known to then form, by appropriate means elastic stresses at at least one of the predetermined positions for structuring of this layer. Within the framework of the invention it has been recognized that the layer can be subjected to a stress-dependent solid-state reaction.

The elastic stresses are so formed that as a result in the layer in the subsequent solid-state reaction, by diffusion processes there will be a stress-oriented enrichment of the layer material at this position. As a result, the layer is interrupted, thereby imparting a structure to the layer. Depending upon the selection of the parameters, for example, the layer thickness, the layer material and the solid-state reaction parameters like temperature and atmosphere, the type of structuring can be established.

It can be sufficient that the solid-state reaction is limited to a few monolayers analogous to that described in the publication "Karen Maex, Materials Science and Engineering RII (1993) 53–153", examples according to FIG. 49 (Ti on $SiO_2$, Co on $SiO_2$).

For forming the elastic stresses, a mask can be formed on the layer to be structured with one or more mask edges. The stresses according to the invention are formed in the layer as a precondition for the structuring by the solid-state reaction. It is however also possible, alternatively or cumulatively to locally so modify the substrate material of the substrate carrying the layer that the stresses are formed at the corresponding layer position. Such a modification can be effective in the form of an ion implantation or by a thermal treatment (layer treatment) either before or after the formation of the layer on the substrate.

It has been found within the framework of the invention that conventional optical lithography can be used for structuring a mask formed on a film. It has been found that along the linearly running mask edges of such a mask stress lines or stress points are formed on the one hand on the film to be structured and on the other hand during application of the solid-state reaction, that this reaction is effected in a stress-dependent manner in the thin film.

It has also been found that the diffusion process during the solid-state reaction, for example for alloy formation, especially silicide formation, is so modified by an elastic stress profile of the mask that a small line (for example 50 nm) is formed along the mask edge in a self-adjusting manner.

The here proposed method serves for the production of the smallest critical structures in the submicrometer range. The method of the invention can be used for the formation of microelectronic or optoelectronic circuitry. The larger structures (typically greater than 0.2 micrometers) can be formed by means of known photolithographic processes. The method of the invention is suitable for generating the nanostructures directly and self-adjusting to the mask edges.

The method of the invention is used especially advantageously for the silicide-on-silicon material system. For example, with the aid of the method of the invention a cobalt disilicide ($CoSi_2$) layer can be deposited on a silicon substrate and structured. Based upon surprising conductivity, the high thermal stability and compatibility with silicon, $CoSi_2$ in addition to $TiSi_2$ has been found to be an especially important material for contacting of microchips. Source, drain and gate contacts can be fabricated with these polycrystalline silicides. For the constantly smaller structural sizes $CoSi_2$ has significant advantages over $TiSi_2$ since the resistance of the conductive paths is independent on the line width (at least to 100 nanometers). Silicides can also be used for structured layer formation also for other microelectronic or solid-state electronic purposes. For example, the use in Schottky barrier photodetectors is advantageous. As a consequence, structures with minimal dimensions, especially in the range of 50 nm or even smaller can be achieved with a method for the structuring layers for nanotechnology in accordance with the method of the invention. The method serves advantageously for the conventional optical lithography in the structuring of a thin film of a mask formed from a thin film (especially a nitride layer) and a stress-dependent solid-state reaction in the ultrathin film formed on a substrate. The solid-state reaction (for example silicide formation) is so modified by the elastic stress profile of the mask (nitride layer) that a small uniform line is formed in thin film (for example silicide) along mask edges in a self-adjusting manner. The line width is adjustable in the sense of the invention. The adjustability of the dimensions of the structure is a function of the film thickness, the thermal treatment and the mask construction. It is possible to form structures with dimensions in the range of 50 to 100 nm.

The advantages of the method of the invention lie in the high resolution capacity of the structuring. The method also enables a high output since the process is not dependent on the size of the substrate carrying the film to be structured. The method involves technologically simple processes and has good reproducibility. The special advantage is that it is not necessary to use submicrometer masks which are expensive to fabricate, for forming submicrometer structures, especially nanostructures. For the use of the method in silicon technology, it suffices to use standard silicon semiconductor standards without requiring the expensive further procedures. Finally, the method of the invention can also be translated to other material systems and other stress-dependent solid-state reactions. The invention can find application in the field of nanoelectronics for the formation of switching elements like, for example, the formation of nanoMOSFETs. The invention can also be used for the production of sensors having nanostructures especially in the field of optical components. It is however also possible to make masks for nanostructures by the process.

The invention is described in greater detail in conjunction with FIG. 1 and specific examples.

BRIEF DESCRIPTION OF THE DRAWING

The invention is described in greater detail in conjunction with FIG. 1 and specific examples, FIG. 1, the sole FIGURE, being a diagram illustrating the principles of the invention.

EXAMPLES

Below numerous examples within the framework of the invention are described.

1. Production of Nanostructures in Ultrathin Cobalt Disilicide Films on Silicon

The starting structure is a layer system as shown in FIG. 1. A thin 8 nm cobalt- (Co—) layer and a 4 nm thick silicon layer are deposited by sputtering (or vapor deposition) and then covered with a thin $SiO_2$ layer (10 nm) and a silicon nitride layer (e.g. 300 nm) serving as a mask. The nitride layer is structured by conventional optical lithography and dry etching. The minimal structure size amounted for example to 1 μm. This structured nitride layer served as a mask for the following tempering process. This masking technique is known in silicon technology as "LOCOS-Technology" and is used for the production of field oxides in MOSFET production (S. Wolf and R. N. Tauber, Silicon Processing for the VLSI Era Vol 1, Lattice Press, Sunset Beach, Calif. 1989).

Thus the samples were heat treated at 750° C. for a duration of 1 minute in nitrogen to convert the metallic cobalt (Co) by solid-state reaction into the silicide $CoSi_2$. The metal reacts at this temperature with the underlying silicon. This silicide formation is a standard process in semiconductor device fabrication and is usually carried out in a rapid thermal annealing (RTA) see K. Maex, Materials Science and Engineering R11 (1993) 53–153). In the framework of the invention, because of the high point stresses at the mask edges in the thin film (FIG. 1) a very uniform line is formed in the silicide layer parallel to the mask edges (self adjusting) and these are thus structured. The silicide does not appear at these locations because of the high elastic stresses. It has been found that the elastic stresses modify the diffusion characteristics of the atoms. The stress profile produces a gradient for the diffusion of the atoms participating in the reaction. This results in a linearly shaped structuring of the silicide layer.

The silicide-free lines or separations form in a self-adjusting manner along the mask edges (FIG. 1). The width of the line typically amounts to 30 to 200 nm. This can be adjusted or varied by the choice of the layer thickness of the resulting silicide, by the temperature treatment and by the mask material and its structure. The line width is exceptionally uniform. The thickness of the resulting silicide layer amounts to 20 nm. This layer thickness is ideal for the contacting of nanoMOSFETS with gate lengths of less than 100 nm.

2. Example: Nanostructures in a Titanium Film on Glass

As has been sketched for the aforedescribed example in FIG. 1, a thin 20 nm thick titanium layer is applied on a glass substrate (e.g. $SiO_2$ on Si). This can be achieved by sputtering or vapor deposition. Then, as in Example 1, the nitride mask is formed. The layer structure is then heat-treated at a subsequently high temperature until along the mask edges, lines or separations (as shown) result in the titanium layer. The line widths in the titanium film depend upon the original titanium layer and the temperature treatment.

3. Application Example: Ultrashort Channel-Schottky-Barrier MOSFET

As has been shown in Example 1, silicide nanostructures (FIG. 1) can be made with this process and can serve as the basis for MOSFET transistors with ultrashort channel lengths (50–100 nm). The process of the device is especially simple with the method of the invention. The structure shown at the lower part of FIG. 1 can be directly used for this purpose. The gate—the structured 50–100 nm wide line—of the transistor is prestructured by the method of the invention in the silicide layer (e.g. $CoSi_2$). For a Schottky-barrier MOSFET as is shown for example from J. P. S. A. Rishton, K. Ismail, J. O. Chu and K. Chan, Microelectr. Eng. 35 (1997) 361 it is known that the left silicide, contact fabricated according to the invention can be used as the source and the intermediate contact as the drain, since $CoSi_2$ forms a Schottky contact for the substrate silicon (Schottky-barrier height 0.42 eV on p-Si). The gate oxide can then be generated by thermal oxidation (e.g. high pressure oxidation). The gate contact can also be made by conventional methods. The nitride mask serves for insulation and passivation.

In the framework of the invention the following should also be noted.

The method of the invention can find application in the production of nanostructures in thin film, whereby in ultrathin films, especially in the range of 1 to 100 nm, lines can be formed uniformly by local elastic process and thermal treatment. This line—shaped structuring can have a width of several nanometers to 300 nanometers or more.

As substrates in the sense of the invention, a layer which lies below the layer to be structured will be understood, this substrate being directly or indirectly connected with a carrier. As the material of the layer a metal like for example Co, Ti, Ni, Pd, Pt, W, Ta or Nb on silicon can be used. In this manner a silicide is formed which during the thermal treatment can be structured bilaterally by the local stresses.

For formation of the elastic stresses, a photolitho-graphic structured mask, for example in the form of a $Si_3N_4/SiO_2$ layer on the film to be structured is formed.

The method of the invention can alternatively be carried out such that through an opening in the mask a locally limited solid-state reaction can be effected in the region of the free-line layer. In the case of a temperature treatment, the tempering atmosphere can be $N_2$ or $O_2$. The local solid-state reaction has the consequence that the film is thereby locally depleted and the latter is separated from the original film in the region which was covered by the mask by the structuring.

The layer which is configured as a thin film can be covered by a thin protective layer (e.g. of silicon) to avoid for example an oxidation. For formation of a mask, an $SiO_2$ layer upon which a $Si_3N_4$ layer is formed can be applied to the layer to be structured.

In the framework of the invention, the method of the invention for producing a submicrometer structure in a layer on a substrate is so carried out that initially on a substrate layer or a multilayer is formed, means is provided for producing elastic stresses at at least one predetermined position of this layer and then the subsequent thermally—induced layer formation-by reaction with the substrate or by reaction within the multiple layers—by the imposed stress is locally so modified that a new directly structured alloy layer results as in Example 1.

It is also possible within the framework of the invention as in Example 2 to operate with titanium on glass so that the self diffusion in the layer on an inert substrate during the temperature treatment is locally so modified through the applied stresses that the layers (without a chemical solid body reaction) flow together at the stress points or are so enriched that they are thereby structured themselves.

What is claimed is:

1. A method of producing a layer having a structure in a form of at least one line having a submicrometer width, comprising the steps of:
   (a) providing a silicon support or a glass support as a substrate;
   (b) depositing a pure metal film on said substrate;
   (c) applying to said pure metal film a mask layer and structuring said mask layer so that an edge of the mask layer is formed along a location for said line, thereby forming a layer system consisting essentially of said substrate, said film and said layer; and
   (d) subjecting said layer system to a thermal treatment at a temperature and for a length of time sufficient to generate tension in said film to produce a tension-dependent separation in said film below said edge with a submicrometer width forming said line solely by the action of the temperature for the said time.

2. The method defined in claim 1 wherein said metal film is composed of a metal selected from the group which consists of cobalt, titanium, nickel, palladium, tungsten, tantalum and niobium.

3. The method defined in claim 2 wherein the mask layer is composed of a material selected from the group which consists of $SiO_2$ and $Si_3N_4$.

4. A method of producing a layer having a structure in a form of at least one line having a submicrometer width, comprising the steps of:
   (a) providing a silicon support or a glass support as a substrate;
   (b) depositing a pure metal film on said substrate;
   (c) applying to said pure metal film a mask layer and structuring said mask layer so that an edge of the mask layer is formed along a location for said line, thereby forming a layer system consisting essentially of said substrate, said film and said layer; and
   (d) subjecting said layer system to a thermal treatment at a temperature and for a length of time sufficient to generate tension in said film to produce a tension-dependent separation in said film below said edge with a submicrometer width forming said line, said metal film being composed of a metal selected from the group which consists of cobalt, titanium, nickel, palladium, tungsten, tantalum and niobium, said mask layer is composed of a material selected from the group which consists of $SiO_2$ and $Si_3N_4$, said layer system being subjected in step (d) to a temperature having a maximum of 750° C. for a period sufficient to produce said separation.

5. The method defined in claim 4 wherein said substrate is silicon, said method further comprising the step of transforming metal of said film to a silicide during step (d).

6. The method defined in claim 5 further comprising the step of modifying said substrate in a region thereof below said edge.

* * * * *